(12) United States Patent
Byeon et al.

(10) Patent No.: US 8,350,362 B2
(45) Date of Patent: Jan. 8, 2013

(54) SEMICONDUCTOR INTEGRATED CIRCUIT AND METHOD FOR FABRICATING THE SAME

(75) Inventors: Sang-Jin Byeon, Gyeonggi-do (KR); Jun-Gi Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 114 days.

(21) Appl. No.: 12/831,341

(22) Filed: Jul. 7, 2010

(65) Prior Publication Data

US 2011/0291229 A1    Dec. 1, 2011

(30) Foreign Application Priority Data

May 28, 2010 (KR) .................. 10-2010-0050497

(51) Int. Cl.
*H01L 29/40* (2006.01)

(52) U.S. Cl. . 257/621; 257/529; 257/774; 257/E23.149; 257/E23.174; 438/667; 438/601

(58) Field of Classification Search .................. 257/621, 257/529, 774, E23.149, E23.174, E21.597, 257/E21.53; 438/667, 601
See application file for complete search history.

(56) References Cited

U.S. PATENT DOCUMENTS

2008/0230912 A1*  9/2008  Lee et al. ..................... 257/758

FOREIGN PATENT DOCUMENTS

| KR | 100438883 | 7/2004 |
|----|-----------|--------|
| KR | 1020080027078 | 3/2008 |
| KR | 1020100011613 | 2/2010 |

OTHER PUBLICATIONS

Notice of Preliminary Rejection issued from Korean Intellectual Property Office on Oct. 4, 2011.

* cited by examiner

*Primary Examiner* — Tu-Tu Ho
(74) *Attorney, Agent, or Firm* — IP & T Group LLP

(57) ABSTRACT

A semiconductor integrated circuit includes: a semiconductor chip; a through-chip via passing through a conductive pattern disposed in the semiconductor chip and cutting the conductive pattern; and an insulation pattern disposed on an outer circumference surface of the through-chip via to insulate the conductive pattern from the through-chip via.

9 Claims, 6 Drawing Sheets

SEMICONDUCTOR INTEGRATED CIRCUIT AND METHOD FOR FABRICATING THE SAME

CROSS-REFERENCE TO RELATED APPLICATIONS

The present application claims priority of Korean Patent Application No. 10-2010-0050497, filed on May 28, 2010, which is incorporated herein by reference in its entirety.

BACKGROUND OF THE INVENTION

Exemplary embodiments of the present invention relate to semiconductor design technology, and more particularly, to a semiconductor integrated circuit and a method for fabricating the same.

In general, packaging technology for semiconductor integrated circuits has been continuously developed to satisfy demands for miniaturization and mounting reliability. Recently, as the high performance of electrical and electronic products has been demanded with the miniaturization of electrical and electronic products, a variety of technologies for a stack package have been developed.

In the semiconductor industry, "stack" means vertically stacking two or more semiconductor chips or packages. When a stack package is applied to a semiconductor memory device, it is possible to realize a product having a memory capacity two or more times larger than a memory capacity which may be realized in a semiconductor integration process. Furthermore, the stack package not only increases the memory capacity, but also has an advantage in the packaging density and the use efficiency of mounting area. Therefore, the research and development for the stack package are being actively conducted.

The stack package may be fabricated by the following methods. First, individual semiconductor chips may be stacked, and then packaged together. Second, packaged individual semiconductor chips may be stacked. The individual semiconductor chips of the stacked semiconductor package are electrically coupled through metallic wires or through silicon vias (TSV). The stack package using TSVs has such a structure that the physical and electrical coupling between semiconductor chips is vertically achieved by TSVs formed in the respective semiconductor chips.

FIG. 1 is a diagram illustrating a TSV.

Referring to FIG. 1, a hole is formed through a semiconductor chip A, and a TSV B is formed by filling the hole with a metal. Then, a semiconductor chip C for stacking is prepared. A plurality of semiconductor chips C are stacked to form a semiconductor integrated circuit which is typically referred to as a 3D (three-dimensional) stack package semiconductor integrated circuit.

FIG. 2 is a perspective view of a 3D stack package semiconductor integrated circuit.

Referring to FIG. 2, the 3D stack package semiconductor integrated circuit (hereafter, referred to as "semiconductor integrated circuit") 100 includes first to fourth semiconductor chips 110 to 140 and TSVs 150 to 170. The first to fourth semiconductor chips 110 to 140 are stacked vertically, and the TSVs 150 and 170 are formed through the second to fourth semiconductor chips 120 to 140, respectively, and configured to interface signals and power among the first to fourth semiconductor chips 110 to 140.

Among the first to fourth semiconductor chips 110 to 140, the first semiconductor chip 110 having no TSV is typically referred to as a master chip. The master chip is configured to buffer an external signal applied from outside, for example, from a controller and control the second to fourth semiconductor chips 120 to 140 through the TSVs 150 to 170. The second to fourth semiconductor chips 120 to 140 which are controlled by the master chip are typically referred to as slave chips.

FIG. 2 illustrates that each of the semiconductor chips includes only one TSV. In reality, however, the semiconductor chip may include at least several hundred to several thousand TSVs. The TSVs 150 to 170 serve to interface signals or power among the semiconductor chips 110 to 140. Accordingly, the TSVs 150 to 170 are formed of a metal having excellent conductivity, for example, Cu.

FIG. 3 is a plan view of the semiconductor integrated circuit 100 of FIG. 2.

In order to describe the configuration of the semiconductor integrated circuit 100, the fourth semiconductor chip 140 including a fuse circuit 180 will be taken as an example.

Referring to FIG. 3, the fourth semiconductor chip 140 includes an active area in which the fuse circuit 180 and other elements are provided and a non-active area in which the TSV 170 is provided. The non-active area may include a predetermined area surrounding the TSV 170 as well as the area in which the TSV 170 is provided. In such a non-active area, a variety of devices including the fuse circuit 180 are not formed, in order to prevent the degradation of the devices caused by the TSV 170. The non-active area includes dummy patterns for compensating level differences from various devices and metal interconnections formed in the active area. When the level differences are compensated by the dummy patterns, a pattern formation process of the TSV 170 may be easily performed.

When a fuse F1 is to be cut, the fuse circuit 180 inverts the logic level state of an output signal before the fuse is cut. Depending on whether or not the fuse F1 is cut, the fuse circuit 180 selectively outputs an option signal OUTPUT through an output terminal. The fuse F1 is a conductive pattern provided between two electrodes and is configured to electrically couple the two electrodes. The fuse F1 may be cut by an external process, such as by a laser.

The operation of the fuse circuit 180 is as follows. When a power-up signal PWRUP is activated, latch units LIN1 and LIN2 are initialized to determine the logic level state of the option signal OUTPUT of the output terminal. On the other hand, when the power-up signal PWRUP is deactivated, the option signal OUTPUT maintains the current state or is inverted and outputted, depending on the coupling state of the fuse F1. Such an option signal OUTPUT may be used for various purposes. For example, when the master chip 110 does not include a TSV and the slave chips 120 to 140 include the TSVs 150 to 170 as illustrated in FIG. 1, the option signal OUTPUT may be used as a signal for discriminating whether the corresponding semiconductor chip is the master chip 110 or the slave chip 120, 130, or 140, depending on the logic level state thereof. Meanwhile, a test mode signal TM is used for restoring the original state after the fuse F1 is cut.

The conventional semiconductor integrated circuit 100 configured in such a manner has the following problems.

As described above, the option signal OUTPUT outputted from the fuse circuit 180 may be used for discriminating the master chip and the slave chips. In order to indicate that a corresponding semiconductor chip is a slave chip, the process of cutting the fuse F1 should be performed. That is, a laser or the like is used to physically cut the fuse F1. As such, when the fuse F1 is to be cut, the fuse cutting process should be additionally performed. Therefore, a fabricating cost and time inevitably increases.

SUMMARY OF THE INVENTION

An embodiment of the present invention is directed to a semiconductor integrated circuit capable of omitting a separate fuse cutting process and a method for fabricating the same.

In accordance with an embodiment of the present invention, a semiconductor integrated circuit includes: a semiconductor chip; a through-chip via passing through a conductive pattern disposed in the semiconductor chip and cutting the conductive pattern; and an insulation pattern disposed on an outer circumference surface of the through-chip via to insulate the conductive pattern from the through-chip via.

In accordance with another embodiment of the present invention, a semiconductor integrated circuit includes: a master chip including first and second circuit units and a first conductive pattern coupling the first and second circuit units; a slave chip including third and fourth circuit units and a second conductive pattern coupling the third and fourth circuit units; a through-chip via passing through the slave chip and the second conductive pattern to couple one end of the through-chip via to the first conductive pattern; an insulation pattern configured to insulate the second conductive pattern from the through-chip via; and a coupling path coupled to another end of the through-chip via and one end of the second conducive pattern and configured to couple the first conductive pattern to one of the third or fourth circuit units.

In accordance with yet another embodiment of the present invention, a method for fabricating a semiconductor integrated circuit includes: determining whether or not a semiconductor chip to be fabricated is a semiconductor chip in which a conductive pattern needs to be cut; in response to the corresponding semiconductor chip being determined to be a semiconductor chip in which a conductive pattern needs to be cut, fabricating the semiconductor chip including the conductive pattern disposed in a formation region of a through-chip via; and forming a through-chip via to pass through the conductive pattern disposed in the formation region of the through-chip via and to cut the conductive pattern.

DESCRIPTION OF SPECIFIC EMBODIMENTS

Figure 1:
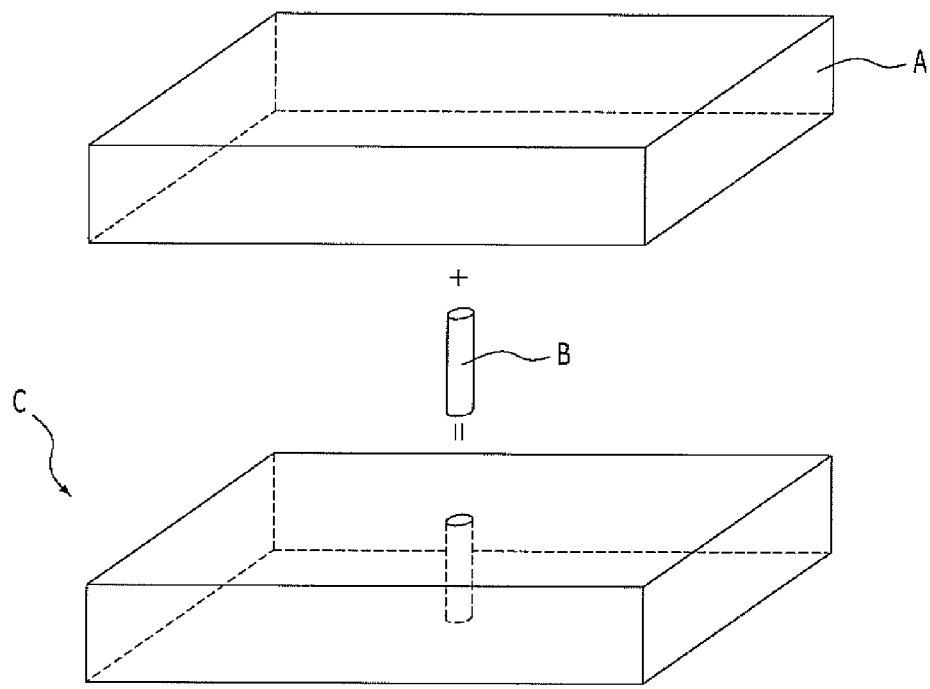
FIG. 1 is a diagram illustrating a through silicon via (TSV).
Figure 2:
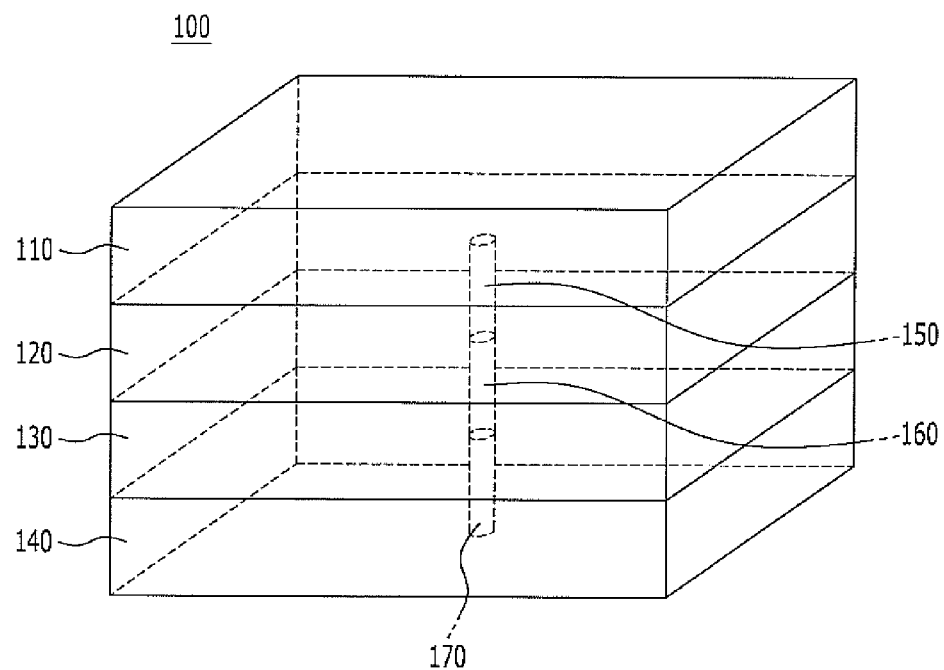
FIG. 2 is a perspective view of a 3D stack package semiconductor integrated circuit.
Figure 3:
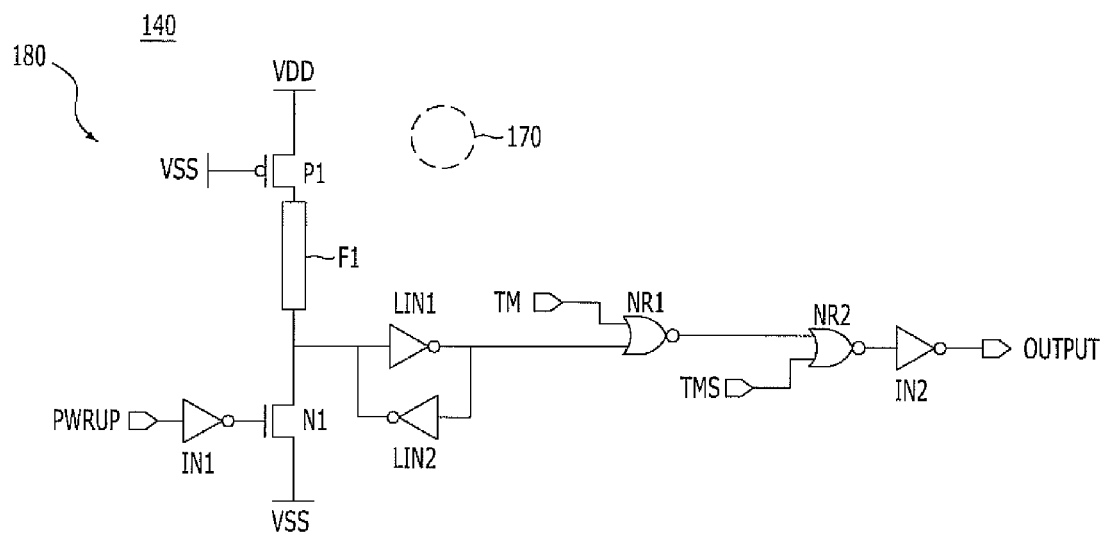
FIG. 3 is a plan view of the semiconductor integrated circuit of FIG. 2.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
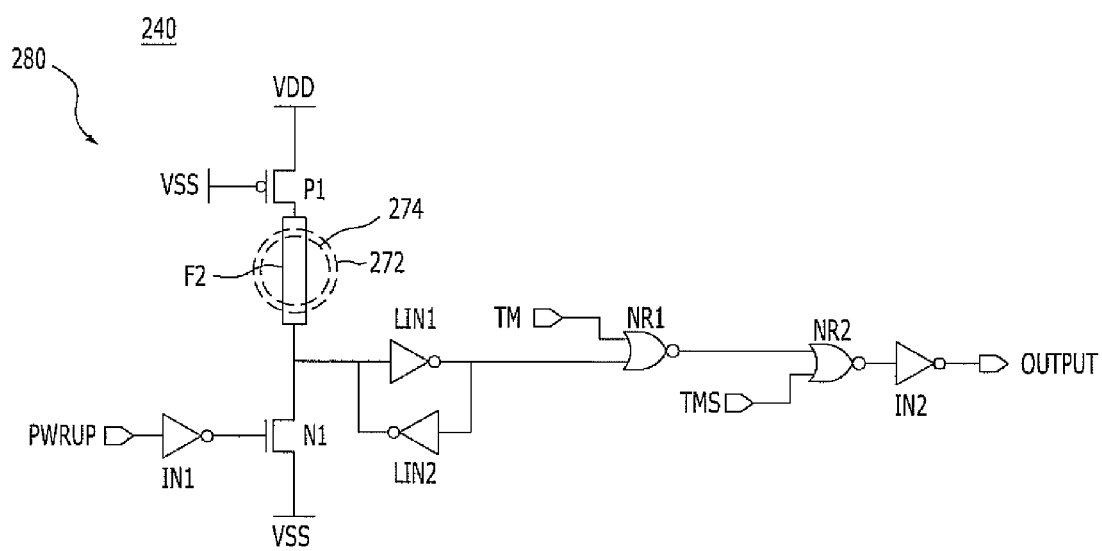
FIG. 4 is a plan view of a semiconductor integrated circuit in accordance with a first embodiment of the present invention.

FIG. 4 is a plan view of a semiconductor integrated circuit in accordance with a first embodiment of the present invention.

For convenience of description, it is assumed that the semiconductor integrated circuit in accordance with the first embodiment of the present invention includes one semiconductor chip and one TSV passing through the semiconductor chip. As a matter of course, the semiconductor integrated circuit in accordance with the first embodiment of the present invention may include a plurality of stacked semiconductor chips, as illustrated in FIG. 1.

Referring to FIG. 4, the semiconductor integrated circuit includes a semiconductor chip 240, a TSV 274, and an insulation pattern 272. The TSV 274 passes through a fuse F2 disposed in the semiconductor chip 240 and cuts the connection of the fuse F2. The insulation pattern 272 is provided on the outer circumferential surface of the TSV 274 to insulate the fuse F2 from the TSV 274. The fuse F2 refers to a conductive pattern which is provided between two electrodes and electrically couples the two electrodes.

The semiconductor chip 240 is a typical silicon substrate including a fuse circuit 280. When the fuse F2 is to be cut, the fuse circuit 280 inverts the logic level state of an output signal before the fuse F2 is cut. Depending on whether or not the fuse F2 is cut, the fuse circuit 280 selectively outputs an option signal OUTPUT through an output terminal. When cutting is required, the fuse F2 is disposed in a formation region of the TSV 274, that is, in a region of the semiconductor chip 240 through which the TSV 274 is to pass. In such a configuration, when the TSV 274 passes through the semiconductor chip 240, the fuse F2 is cut simultaneously. Therefore, a process of cutting the fuse F2 does not need to be performed separately. For reference, the case in which cutting is required may include a case in which a determination is to be made as to whether the semiconductor chip 240 is a master chip or slave chip, for example. Whether the semiconductor chip 240 is a master chip or slave chip may be determined by the logic level state of an option signal OUTPUT outputted by the fuse circuit 280, depending on whether or not the fuse F2 is cut.

The TSV 274 serves to interface signals or power between the stacked semiconductor chips which are not illustrated in FIG. 4. Therefore, the TSV 274 may be formed of a metal having excellent conductivity, for example, Cu. The semiconductor chip 210 may include at least several hundred to several thousand TSVs 274 passing therethrough.

Since the TSV 274 is formed of a conductor, the insulation pattern 272 is provided to insulate the fuse F2 from the TSV 274. As the insulation pattern 272 is provided, the fuse F2 is reliably cut.

Hereafter, a method for fabricating the semiconductor integrated circuit in accordance with the first embodiment of the present invention will be described with reference to FIG. 5.

Figure 5:
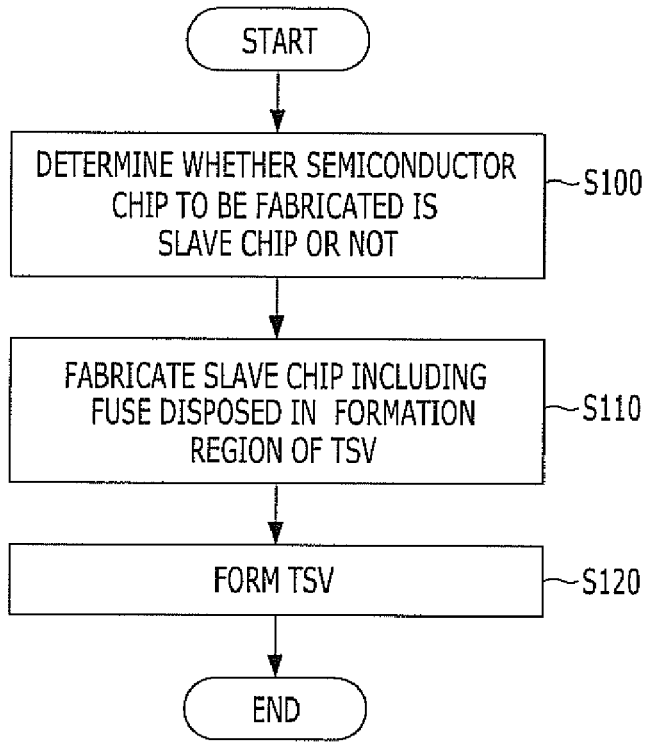
FIG. 5 is a flowchart illustrating a method for fabricating the semiconductor integrated circuit in accordance with the first embodiment of the present invention.

FIG. 5 is a flowchart explaining the method for fabricating the semiconductor integrated circuit in accordance with the first embodiment of the present invention.

Referring to FIG. 5, in step S100, a determination is made as to whether or not a fuse F2 included in a semiconductor chip 240 to be fabricated needs to be cut. For example, when the semiconductor chip 240 is used as a master chip, the fuse F2 included in the semiconductor chip 240 does not need to be cut. On the other hand, when the semiconductor chip 240 is used as a slave chip, the fuse F2 included in the semiconductor chip 240 needs to be cut. Hereafter, the semiconductor chip including a fuse which needs to be cut is referred to as a slave chip.

When the semiconductor chip 240 is determined to be a slave chip, the semiconductor chip 240 including the fuse f2 disposed in the formation region of the TSV 274 is fabricated in step S110. The formation region of the TSV 274 refers to a region of the semiconductor chip 240, through which the TSV 274 is to pass.

In step S120, the TSV 274 is formed to pass through the fuse F2 disposed in the formation region of the TSV 274 and cut the coupling of the fuse F2. FIGS. 6A to 7D illustrate the step S120. At this time, since the fuse F2 and the TSV 274 are formed of a conductor, an insulation pattern 272 for insulating the fuse F2 from the TSV 274 is also formed.

FIGS. 6A to 6D illustrate the process in which the insulation pattern 272 and the TSV 274 are formed to cut the fuse F2. FIGS. 7A to 7D are side cross-sectional views of FIGS. 6A to 6D, respectively.

Figure 6A:
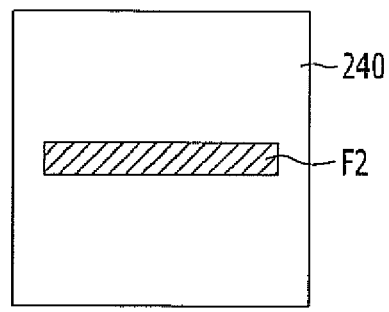
FIGS. 6A to 6D illustrate a process in which an insulation pattern and a TSV of FIG. 4 are formed to cut a fuse.
Figure 6B:
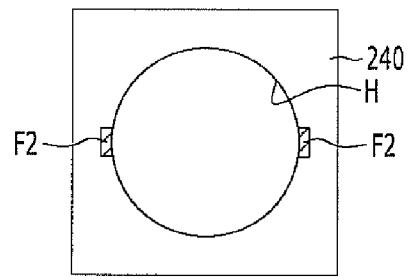
Figure 6C:
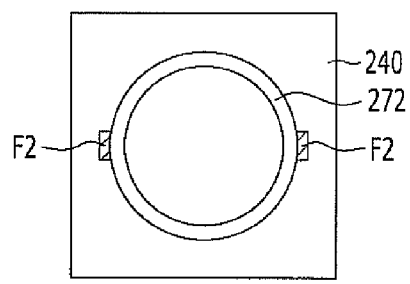
Figure 6D:
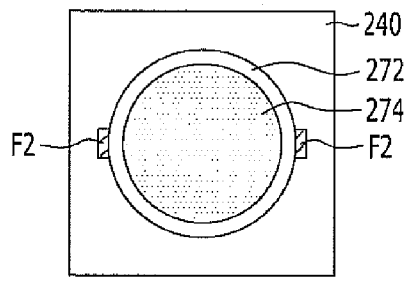
Figure 7A:
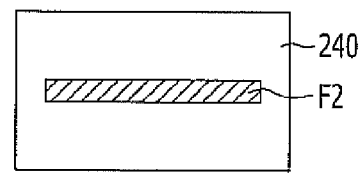
FIGS. 7A to 7D are side cross-sectional views of FIGS. 6A to 6D, respectively.
Figure 7B:
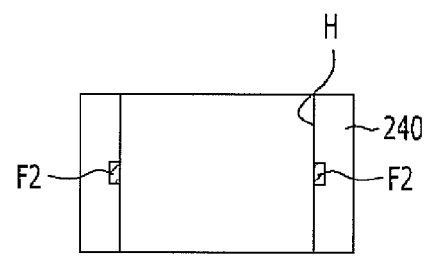
Figure 7C:
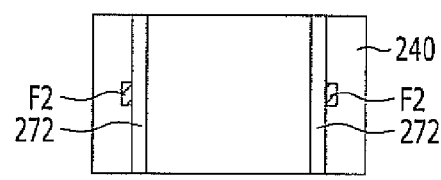
Figure 7D:
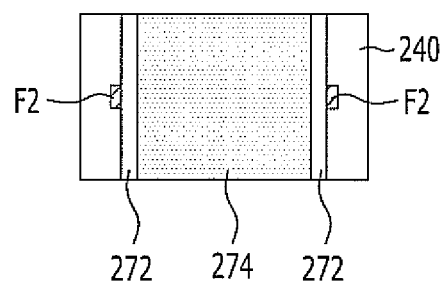

Referring to FIGS. 6A and 7A, the fuse F2 is formed in the formation region of the TSV 274 on the entire surface region of the semiconductor chip 240. Referring to FIGS. 6B and 7B, a hole H is formed in the position through which the TSV 274 is to pass. Referring to FIGS. 6C and 7C, a belt-shaped insulation pattern 272 is formed on the surface of the hole H. Referring to FIGS. 6D and 7D, the TSV 274 is formed by filing the hole H with a metal, such as Cu. Therefore, as the insulation pattern 272 and the TSV 274 are formed, the fuse F2 may be reliably cut at the same time when the TSV 274 is formed in the formation region.

In accordance with the first embodiment of the present invention, as the fuse F2 is disposed in the formation region of the TSV 274, the fuse F2 may be cut when the formation process of the TSV 274 is performed. Therefore, the entire process may be simplified to reduce a fabricating cost and time.

Figure 8:
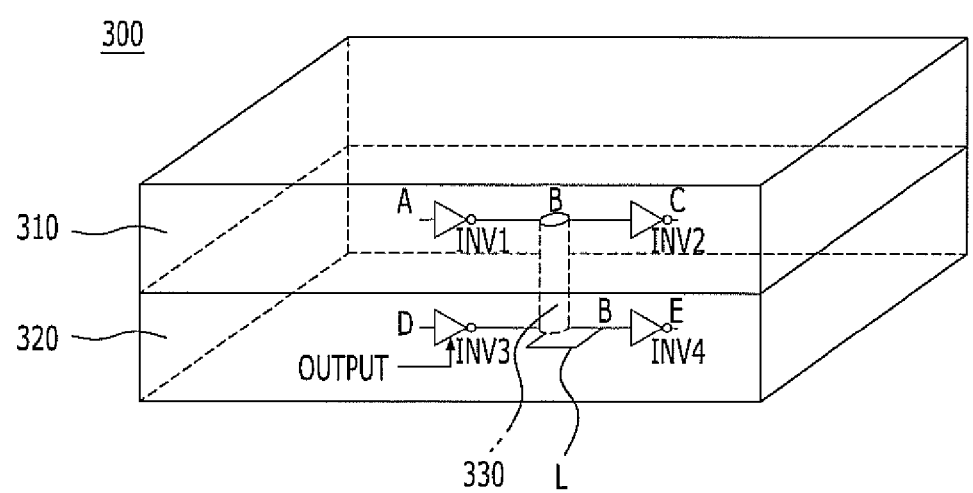
FIG. 8 is a perspective view of a semiconductor integrated circuit in accordance with a second embodiment of the present invention.

FIG. 8 is a perspective view of a semiconductor integrated circuit in accordance with a second embodiment of the present invention.

For convenience of description, it is assumed that the semiconductor integrated circuit in accordance with the second embodiment of the present invention includes one master chip, one slave chip, and one TSV passing through the slave chip.

Referring to FIG. 8, the semiconductor integrated circuit 300 includes a master chip 310 having a first circuit unit, a slave chip having a second circuit unit, and a TSV 330 passing through the slave chip 320 and forming a common node B between the first and second circuit units.

The master chip 310 is a semiconductor chip configured to control the slave chip 310. The first circuit unit of the master chip 310 includes first and second inverters INV1 and INV2. The first inverter is configured to receive a signal applied to a node A and output an inverted signal to a node B, and the second inverter is configured to receive a signal applied to the node B and output an inverted signal to a node C. However, the first circuit unit is configured in an arbitrary manner, for convenience of description. Therefore, various types of circuits may be applied as the first circuit unit.

The slave chip 320 is a semiconductor chip configured to perform a predetermined operation according to the control of the master chip 310. The second circuit unit included in the slave chip 320 may have substantially the same configuration as the first circuit unit including the inverters INV1 and INV2.

That is, the second circuit unit includes third and fourth inverters INV3 and INV4, for example. However, a coupling path L is formed in the second circuit unit to have the common node B with the first circuit unit through the TVS 330. The coupling path L is configured to couple a coupling pad formed at one end of the TSV 330 to an input terminal of the fourth inverter INV4. The coupling pad is not illustrated. The third inverter INV3 of the second circuit unit is disabled in response to a predetermined signal. For example, the option signal OUTPUT outputted from the fuse circuit 280 described in the first embodiment of the present invention may be used as the predetermined signal.

As the TSV 330 passes between the third and fourth inverters INV3 and INV4 of the second circuit unit, the coupling between the nodes D and B of the second circuit unit is cut, and simultaneously, the second circuit unit shares the node B of the first circuit unit.

Although not illustrated, an insulation pattern is provided on the outer circumferential surface of the TSV 330. The insulation pattern serves to actually cut the coupling between the nodes D and B of the second circuit unit.

Hereafter, the operation of the semiconductor integrated circuit in accordance with the second embodiment of the present invention will be described.

When the semiconductor chip is determined to be a slave chip, the third inverter INV3 of the slave chip 320 is disabled in response to a predetermined signal. The option signal OUTPUT outputted from the fuse circuit 280 described in the first embodiment of the present invention may be used as the predetermined signal.

In this state, the first inverter INV1 of the master chip 310 inverts a signal applied to the node A and outputs the inverted signal to the common node B.

Then, the second inverter INV2 inverts the signal of the common node B, and outputs the inverted signal to the node C. Simultaneously, the signal applied to the common node B is transferred to the second circuit unit 322 of the slave chip 320 through TSV 330. Since the second circuit unit 322 shares the common node B through the coupling path L, the fourth inverter INV4 inverts the signal applied to the common node B, and outputs the inverted signal to a node E.

In accordance with the second embodiment of the present invention, a circuit duplicate to that of the master chip 310, among the circuits composing the slave chip 320, may be disabled. Therefore, it is possible to reduce the power consumption.

In accordance with the embodiments of the present invention, when the process for forming the TSV is performed, the conductive pattern disposed in the formation region of the TSV is also cut. Therefore, a separate cutting process of the conductive pattern may be omitted. Therefore, the entire process of the semiconductor integrated circuit may be simplified to reduce a fabricating cost and time.

Furthermore, when a duplicate circuit between a plurality of semiconductor chips, that is, a master chip and a slave chip is provided, a common node between the duplication circuits may be formed by using a TSV. Then, the number of circuits to be enabled may be reduced, which makes it possible to reduce the power consumption.

While the present invention has been described with respect to the specific embodiments, it will be apparent to those skilled in the art that various changes and modifications may be made without departing from the spirit and scope of the invention as defined by the following claims.

For example, in the first embodiment of the present invention, it has been described that the both ends of the fuse are cut. Without being limited thereto, however, cutting the connection of various conductive patterns which are electrically coupled may be applied.

Furthermore, in the second embodiment of the present invention, a duplicate circuit between the master chip and the slave chip has been taken as an example. Without being limited thereto, however, a circuit for sharing a predetermined signal and so on may be applied.

What is claimed is:

1. A semiconductor integrated circuit comprising:
   a semiconductor chip;
   a through-chip via passing through a conductive pattern disposed in the semiconductor chip and cutting the conductive pattern; and
   an insulation pattern disposed on an outer circumference surface of the through-chip via to insulate the conductive pattern from the through-chip via,
   wherein the through-chip via is filled with a conductive material and is arranged within the semiconductor integrated circuit to be electrically insulated from the conductive pattern,
   wherein the conductive pattern comprises a fuse.

2. The semiconductor integrated circuit of claim 1, wherein the through-chip via comprises a through silicon via (TSV).

3. The semiconductor integrated circuit of claim 1, wherein the insulation pattern is belt-shaped and surrounds the outer circumferential surface of the through-chip via.

4. A semiconductor integrated circuit comprising:
   a master chip comprising first and second circuit units and a first conductive pattern coupling the first and second circuit units;
   a slave chip comprising third and fourth circuit units and a second conductive pattern coupling the third and fourth circuit units;
   a through-chip via passing through the slave chip and the second conductive pattern, one end of the through-chip via being coupled to the first conductive pattern;
   an insulation pattern configured to insulate the second conductive pattern from the through-chip via; and
   a coupling path coupled to another end of the through-chip via and one end of the second conducive pattern and configured to couple the first conductive pattern to one of the third or fourth circuit units.

5. The semiconductor integrated circuit of claim 4, wherein the circuit unit of the third and fourth circuit units, which is isolated from the coupling path, is disabled in response to an operation control signal.

6. The semiconductor integrated circuit of claim 5, wherein the operation control signal comprises an option signal for discriminating the master chip and the slave chip.

7. The semiconductor integrated circuit of claim 4, wherein each conductive pattern comprises a metal interconnection.

8. The semiconductor integrated circuit of claim 4, wherein the through-chip via comprises a through silicon via (TSV).

9. The semiconductor integrated circuit of claim 4, wherein the insulation pattern is belt-shaped and surrounds the circumferential surface of the through- chip via.

* * * * *